(12) United States Patent
Kamoshida

(10) Patent No.: US 8,644,069 B2
(45) Date of Patent: Feb. 4, 2014

(54) SEMICONDUCTOR MEMORY DEVICE

(75) Inventor: Masahiro Kamoshida, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 13/422,446

(22) Filed: Mar. 16, 2012

(65) Prior Publication Data

US 2012/0236664 A1     Sep. 20, 2012

(30) Foreign Application Priority Data

Mar. 17, 2011   (JP) ................... 2011-058964

(51) Int. Cl.
G11C 11/34       (2006.01)
(52) U.S. Cl.
USPC ............ 365/185.05; 365/189.09; 365/189.19; 365/63
(58) Field of Classification Search
USPC ...................... 365/185.05, 189.09, 189.19, 63
See application file for complete search history.

(56) References Cited

U.S. PATENT DOCUMENTS 6,295,227 B1 *   9/2001   Sakui et al. ............... 365/185.17
2012/0014164 A1   1/2012   Kamoshida et al.

FOREIGN PATENT DOCUMENTS

JP       63-273330       11/1988
JP       5-77333         10/1993

* cited by examiner

Primary Examiner — Jason Lappas
(74) Attorney, Agent, or Firm — Oblon, Spivak, McClelland, Maier & Neustadt, L.L.P.

(57) ABSTRACT

According to one embodiment, there is provided a semiconductor memory device including a memory cell array, a plurality of signal lines, and a plurality of signal-line-lead-out portions. In the memory cell array, a plurality of memory cells are arranged. The plurality of signal lines connected to the plurality of memory cells. The plurality of signal-line-lead-out portions are arranged in a periphery of the memory cell array and are connected to the plurality of signal lines. Each of the plurality of signal-line-lead-out portions includes a plug as an electrode whose upper surface and side surface are covered with a passivation film.

20 Claims, 12 Drawing Sheets

SEMICONDUCTOR MEMORY DEVICE

CROSS-REFERENCE TO RELATED APPLICATIONS

This application is based upon and claims the benefit of priority from Japanese Patent Application No. 2011-058964, filed on Mar. 17, 2011; the entire contents of which are incorporated herein by reference.

FIELD

Embodiments described herein relate generally to a semiconductor memory device.

BACKGROUND

In recent years, the demands for small-size, high-capacity information recording/reproducing device (memory device) have been rapidly expanding. Among them, NAND flash memory and a small-size HDD (hard disk drive) have rapidly evolved in recording density and created a large market. Under these circumstances, several ideas for novel memory have been proposed in an effort to significantly exceed the limit of memory density. Among them, non-volatile semiconductor memory, which employs a variable resistance material having a low resistance state and a high resistance state, is attracting attention.

Non-volatile semiconductor memory includes a memory cell array in which a plurality of memory cells are arranged at intersection points between a plurality of bit lines and a plurality of word lines, and the recording density of the memory cell array is expected to increase with the miniaturization of the memory cell.

Meanwhile, when memory cells are debugged, it is often difficult to specify a defective part on a circuit by only output from a pad of a chip. In order to make it easy to debug, a waveform of a signal line such as a bit line or a word line needs to be observed if at all possible. To this end, metallic pieces electrically connected to signal lines are formed on a top interconnection layer. A hole is formed to make a metallic piece to be connected to a signal line of a defective bit to be selectively exposed by a focused ion beam (FIB) when a failure occurs. A probe electrode is formed by filling the hole with a conductive material. A needle of a pico-probe comes into contact with the probe electrode, and then a waveform of the signal line is observed.

However, a space of a bit line or a word line is reduced with the miniaturization of the memory cell, and thus it becomes difficult to form a metallic piece for observing a waveform of a signal line such as a bit line or a word line.

DETAILED DESCRIPTION

In general, according to one embodiment, there is provided a semiconductor memory device including a memory cell array, a plurality of signal lines, and a plurality of signal-line-lead-out portions. In the memory cell array, a plurality of memory cells are arranged. The plurality of signal lines connected to the plurality of memory cells. The plurality of signal-line-lead-out portions are arranged in a periphery of the memory cell array and are connected to the plurality of signal lines. Each of the plurality of signal-line-lead-out portions includes a plug as an electrode whose upper surface and side surface are covered with a passivation film.

Exemplary embodiments of a semiconductor memory device will be explained below in detail with reference to the accompanying drawings. The present invention is not limited to the following embodiments.

First Embodiment

Figure 1:
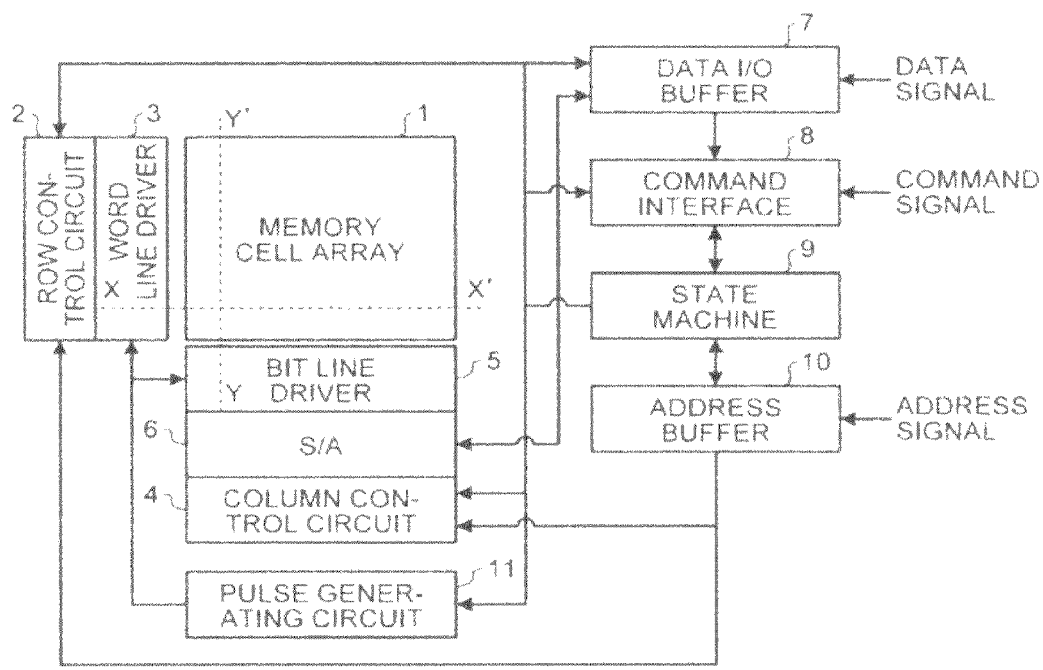
FIG. 1 is a diagram illustrating a configuration of a semiconductor memory device according to a first embodiment.
Figure 2:
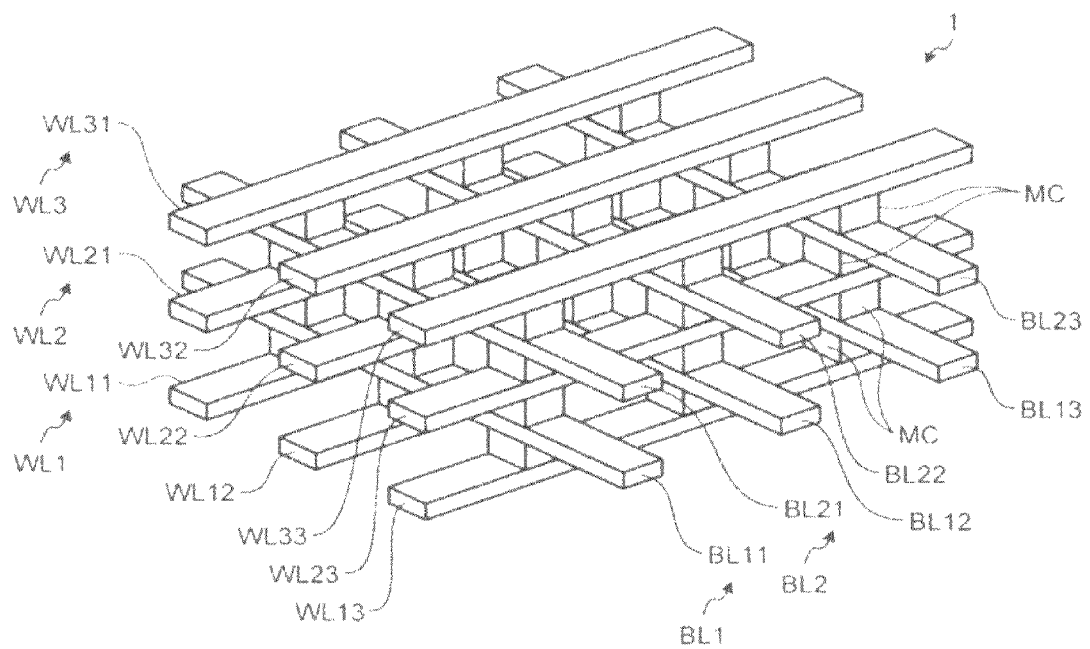
FIG. 2 is a diagram illustrating a configuration of a memory cell array according to the first embodiment.

A semiconductor memory device 100 according to a first embodiment will be described with reference to FIGS. 1 and 2. FIG. 1 is a diagram illustrating a configuration of the semiconductor memory device 100. FIG. 2 is a diagram illustrating a configuration of a memory cell array 1.

The semiconductor memory device 100 includes a memory cell array 1, a plurality of word lines WL1 to WL3, a word line driver 3, a plurality of bit lines BL1 and BL2, a column control circuit 4, and a row control circuit 2.

In the memory cell array 1, a plurality of memory cells MC are three-dimensionally arranged as illustrated in FIG. 2. In other words, a plurality of memory cells MC are two-dimensionally arranged at positions at which a plurality of word lines WL11 to WL13 intersect a plurality of bit lines BL11 to BL13. Similarly, a plurality of memory cells MC are two-dimensionally arranged at positions at which a plurality of bit lines BL11 to BL13 intersect a plurality of word lines WL21 to WL23. A three-dimensional array is implemented such that the two-dimensional arrays (memory layers) are stacked. For example, a memory cell MC may be configured such that a variable resistance layer and a diode layer are stacked. In other words, the semiconductor memory device 100 may be resistance random access memory (ReRAM) including a cross-point type memory cell array 1.

A plurality of word lines WL11 to WL33 illustrated in FIG. 2 extend between a plurality of memory cells MC in a direction parallel to a row.

The row control circuit 2 and the word line driver 3 illustrated in FIG. 1 are provided at positions adjacent to the memory cell array 1 in a direction in which the word line WL extends. The row control circuit 2 drives the word line WL through the word line driver 3. For example, the row control circuit 2 selects the word line WL through the word line driver 3, and applies a voltage necessary for an operation of erasing data in a memory cell, an operation of writing data in a memory cell, and an operation of reading data from a memory cell.

The word line driver 3 includes a word-line-lead-out area for transfering out a signal of a word line as will be described later.

A plurality of bit lines BL11 to BL23 illustrated in FIG. 2 extend between a plurality of memory cells MC in a direction parallel to a column.

The column control circuit 4, a bit line driver 5, and a sense amplifier 6 illustrated in FIG. 1 are provided at positions adjacent to the memory cell array 1 in a direction in which the bit line BL extends. The column control circuit 4 drives the bit line BL through the bit line driver 5. For example, the column control circuit 4 controls the bit line BL such that an operation of erasing data in a memory cell, an operation of writing data in a memory cell, or an operation of reading data from a memory cell is performed. The column control circuit 4 amplifies read data through the sense amplifier 6, and outputs the amplified data to a data I/O buffer 7.

The bit line driver 5 includes a bit-line-lead-out area for transfering out a signal of a bit line as will be described later.

The data I/O buffer 7 is connected to an external host (not shown) through an external I/O line. The data I/O buffer 7 receives write data (a data signal), receives an erase command, outputs read data, and receives address data or command data. The data I/O buffer 7 transfers the received write data (data signal) to the column control circuit 4, and receives read data from the column control circuit 4 and outputs the received read data to the outside.

An address buffer 10 transfers an address signal supplied from the outside to the column control circuit 4 and the row control circuit 2 in response to a command from a state machine 9.

A command interface 8 receives a command signal supplied from the host, and determines whether data input to the data I/O buffer 7 is write data, a command, or an address. When the data is a command, the command interface 8 transfers the received command signal to the state machine 9. The state machine 9 controls the non-volatile memory device in general. That is, the state machine 9 receives a command from the host, and performs a read operation, a write operation, an erase operation, data input/output control, and the like. Further, the external host receives status information managed by the state machine 9 and can determine an operation result. Further, the status information is used for control of the write operation or the erase operation.

Further, the state machine 9 controls a pulse generating circuit 11. Under this control, the pulse generating circuit 11 can output an arbitrary voltage and an arbitrary timing pulse. Here, the generated pulse can be transferred to an arbitrary interconnection selected by the column control circuit 4 and the row control circuit 2.

Figure 3:
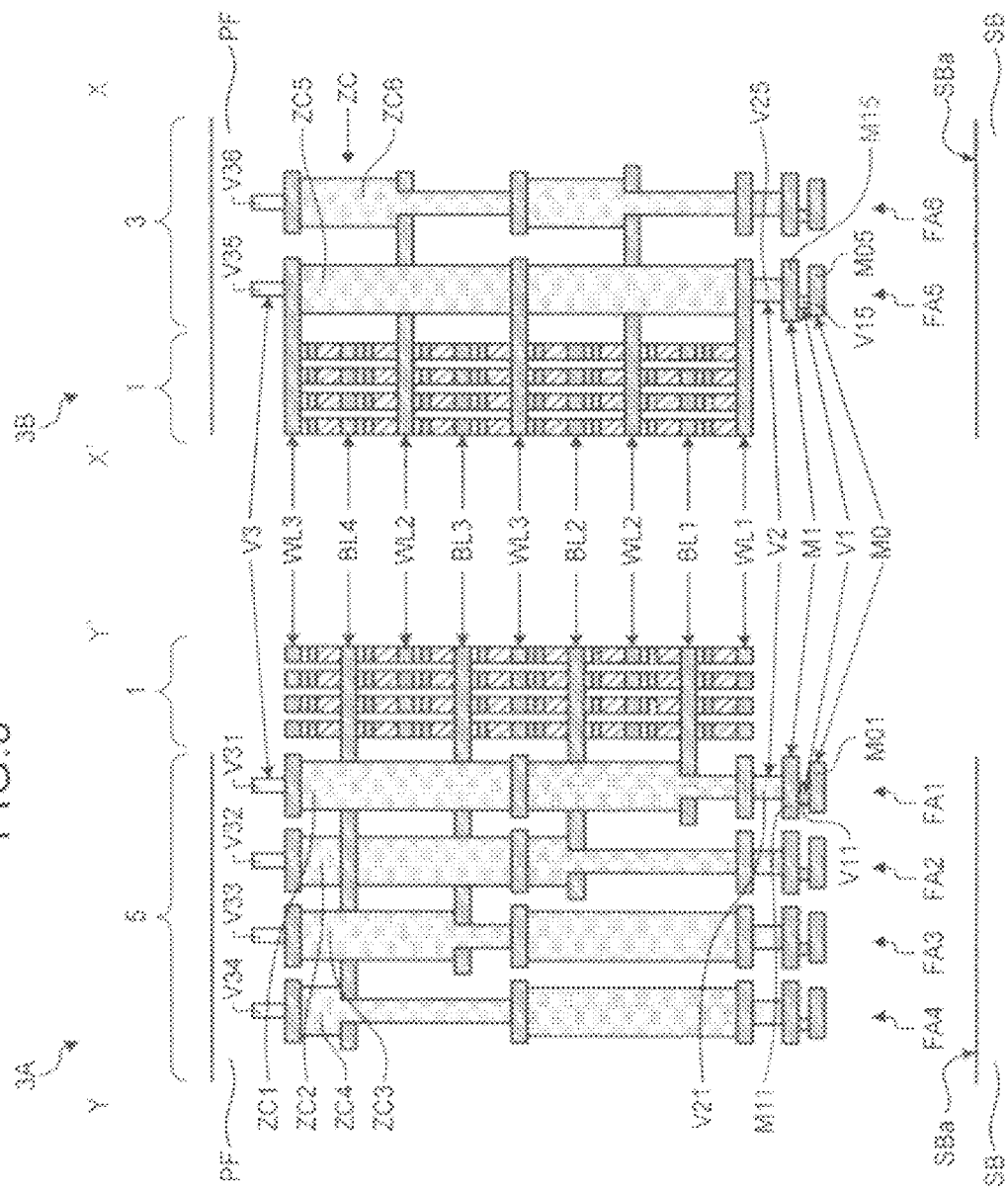
FIG. 3 is a diagram illustrating a cross-sectional structure of a signal-line-lead-out area according to the first embodiment.

Next, a cross-sectional structure of the signal-line-lead-out area will be described with reference to FIG. 3. The signal-line-lead-out area includes the bit-line-lead-out area in the bit line driver 5 and the word-line-lead-out area in the word line driver 3 as described above. FIG. 3A is a cross-sectional view taken along a line Y-Y' of FIG. 1 and is a diagram illustrating a cross-sectional structure of the bit-line-lead-out area. FIG. 3B is a cross-sectional view taken along a line X-X' of FIG. 1 and is a diagram illustrating a cross-sectional structure of the word-line-lead-out area.

As illustrated in FIG. 3A, a plurality of hook-ups (a plurality of bit-line-lead-out portions) FA1 to FA4 are arranged in the bit-line-lead-out area. In other words, the plurality of hook-ups FA1 to FA4 are arranged in the bit line driver 5 adjacent to the memory cell array 1 in a direction in which the bit lines BL extends (a first side) (see FIG. 1). The plurality of hook-ups FA1 to FA4 are connected to a plurality of bit lines BL1 to BL4, respectively.

In the hook-up FA1, a conductive pattern M01 of a wiring layer M0, a plug V11 of a plug layer V1, a conductive pattern M11 of a wiring layer M1, a plug V21 of a plug layer V2, a plug ZC1 of a plug layer ZC, a conductive pattern of a wiring layer WL3, and a plug V31 of a plug layer V3 are stacked in order. For example, each plug layer is formed of metal having tungsten as a main component. For example, each wiring layer is formed of metal having aluminum as a main component.

The plug ZC1 is connected to the bit line BL1 between an upper portion and a lower portion thereof. The hook-up FA1 is configured to transfer out a signal of the bit line BL1 in a vertical direction and transfer the signal to the plug V31. In other words, the plug V31 is provided as an inspection electrode whose upper surface and side surface are covered with a passivation film PF. When it is found that the bit line BL1 is connected to a defective bit, the plug V31 is selectively exposed by a Focused Ion Beam (FIB), and a probe electrode is formed on the plug V31 (see FIGS. 6 and 7).

Similarly, the remaining hook-ups FA2 to FA4 are connected to bit lines BL2 to BL4, respectively, and transfer out signals of the bit lines BL2 to BL4 and transfer the signals to the plugs V32 to V34, respectively.

As illustrated in FIG. 3B, a plurality of hook-ups (a plurality of word-line-lead-out portions) FA5 and FA6 are arranged in the word-line-lead-out area. In other words, the plurality of hook-ups FA5 and FA6 are arranged in the word line driver 3 adjacent to the memory cell array 1 in a direction in which the word line WL extends (a second side) (see FIG. 1). The plurality of hook-ups FA5 and FA6 are connected to a plurality of word lines WL1 to WL3, respectively.

In the hook-up FA5, a conductive pattern M05 of a wiring layer M0, a plug V15 of a plug layer V1, a conductive pattern M15 of a wiring layer M1, a plug V25 of a plug layer V2, a plug ZC5 of a plug layer ZC, a conductive pattern of a wiring layer WL3, and a plug V35 of a plug layer V3 are stacked in order. For example, each plug layer is formed of metal having tungsten as a main component. For example, each wiring layer is formed of metal having aluminum as a main component.

The plug ZC5 is connected to the word line WL3 between an upper portion and a lower portion thereof, is connected to the word line WL1 between the lower portion thereof and the plug V25, and is connected to the word line WL3 between the upper portion thereof and the plug V35. The hook-up FA5 is configured to transfer out a signal of the word line WL1 or WL3 in a direction vertical to a principal surface SBa of a semiconductor substrate SB and transfer the signal to the plug V35. In other words, the plug V35 is provided as an inspection electrode whose upper surface and side surface are covered with a passivation film PF. When it is found that the word line WL1 or WL3 is connected to a defective bit, the plug V35 is selectively exposed by an FIB (Focused Ion Beam), and a probe electrode is formed on the plug V35 (see FIGS. 6 and 7).

Similarly, the remaining hook-up FA6 is connected to the word line WL2, and transfers out a signal of the word line WL2 and transfers the signal to the plug V36.

Figure 4:
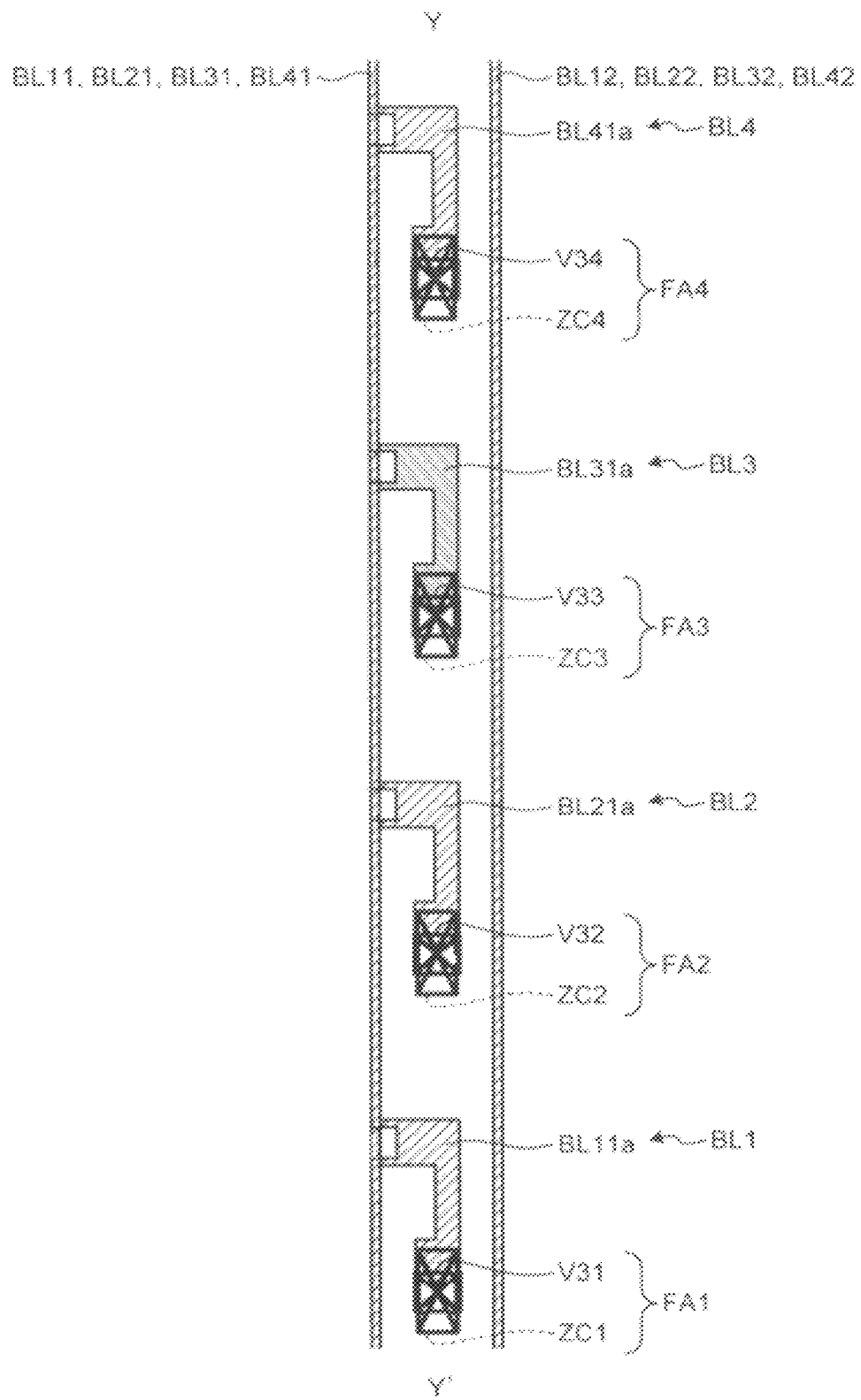
FIG. 4 is a diagram illustrating a layout configuration of a signal-line-lead-out area according to the first embodiment.
Figure 5:
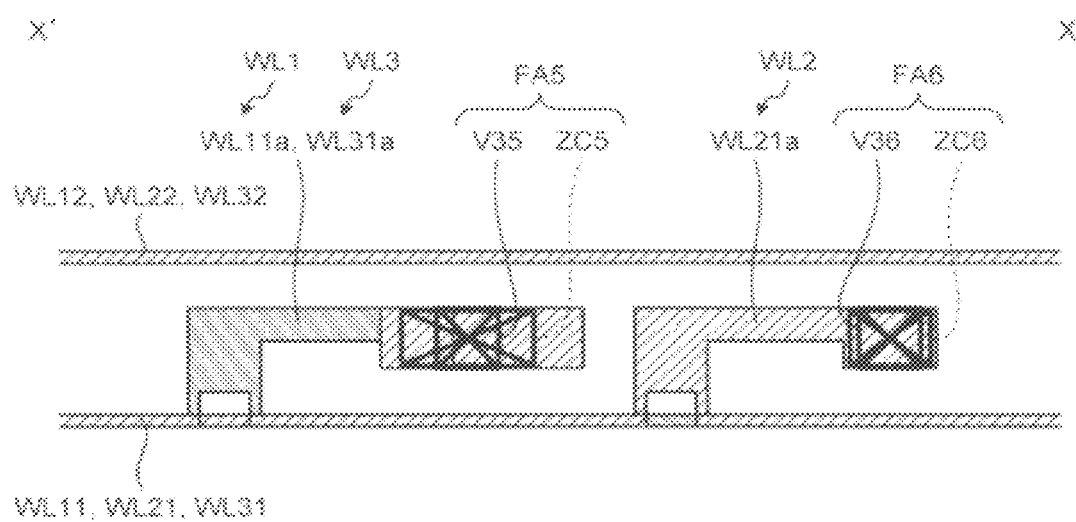
FIG. 5 is a diagram illustrating a layout configuration of a signal-line-lead-out area according to the first embodiment.

Next, a layout configuration of a signal-line-lead-out area will be described with reference to FIGS. 4 and 5. The signal-line-lead-out area includes the bit-line-lead-out area in the bit line driver 5 and the word-line-lead-out area in the word line driver 3 as described above. FIG. 4 is a plane view of a portion along the line Y-Y' of FIG. 1 and is a view illustrating a layout configuration of the bit-line-lead-out area. FIG. 5 is a plane view of a portion along the line X-X' of FIG. 1 and is a view illustrating a layout configuration of the word-line-lead-out area.

As illustrated in FIG. 4, in the bit-line-lead-out area, the plurality of hook-ups FA1 to FA4 are arranged between the bit lines BL11, BL21, BL31, and BL41 to be connected and the bit lines BL12, BL22, BL32, and BL42 adjacent thereto. The plurality of hook-ups FA1 to FA4 are arranged along the bit lines BL11, BL21, BL31, and BL41 to be connected. In other words, the bit lines BL11, BL21, BL31, and BL41 are connected between upper portions and lower portions of the plugs ZC1, ZC2, ZC3, and ZC4, for example, via reverse L-shaped connection patterns BL11a, BL21a, BL31a, and BL41a, respectively. In the hook-ups FA1 to FA4, the plugs V31, V32, V33, and V34 are arranged at positions overlapping the plugs ZC1, ZC2, ZC3, and ZC4, respectively. As described above, the plugs V31 to V34 functioning as inspection electrodes are arranged at positions not interfering with the bit lines BL11 to BL41 and BL12 to BL42 of both sides in a planar view. The bit lines BL11 to BL41 extend at positions overlapping to each other in a planar view. Similarly, the bit lines BL12 to BL42 extend at positions overlapping to each other in a planar view.

As illustrated in FIG. 5, in the word-line-lead-out area, the plurality of hook-ups FA5, FA6 are arranged between word lines WL11, WL21, and WL31 to be connected and word lines WL12, WL22, and WL32 adjacent thereto. The plurality of hook-ups FA5 and FA6 are arranged along the word lines WL11, WL21, and WL31 to be connected. In other words, the word lines WL11, WL21, and WL31 are connected between upper portions and lower portions of the plugs ZC5 and ZC6, for example, via lateral L-shaped connection patterns WL11a, WL21a, and WL31a, respectively. In the hook-ups FA5 and FA6, the plugs V35 and V36 are arranged at positions overlapping the plugs ZC5 and ZC6, respectively. As described above, the plugs V35 and V36 functioning as inspection electrodes are arranged at positions not interfering with the word lines WL11 to WL31 and WL12 to WL32 of both sides in a planar view. The word lines WL11 to WL31 extend at positions overlapping to each other at a planar view. Similarly, the word lines WL12 to WL32 extend at positions overlapping to each other at a planar view.

Next, in order to clarify effects according to the first embodiment, a process of observing a waveform of a bit line or a word line using the plugs V31 to V34 or the plugs V35 and V36 as inspection electrodes will be described with reference to FIGS. 6A and 6B and FIG. 7.

Figure 6:
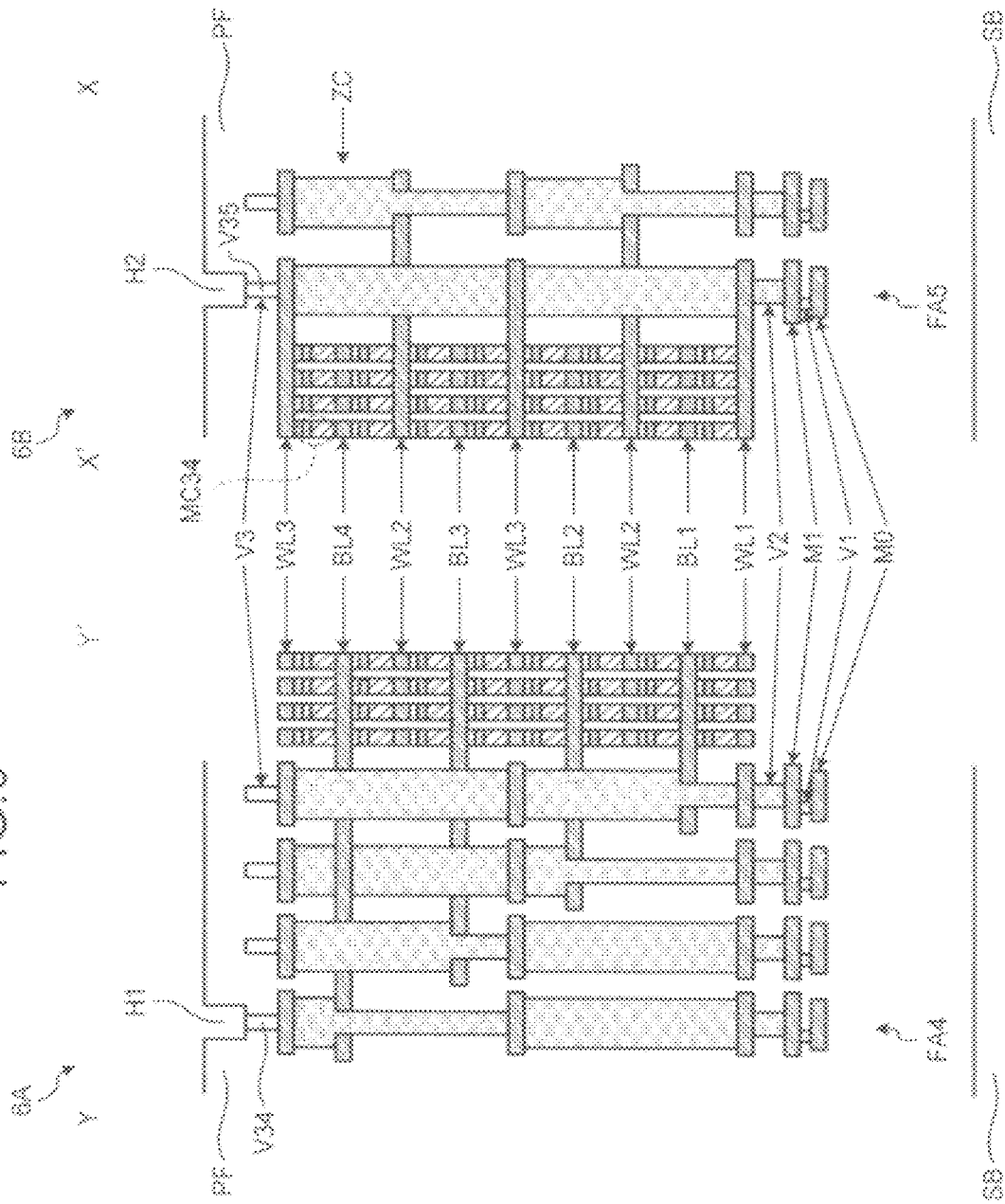
FIG. 6 is a diagram illustrating an effect according to the first embodiment.

When a defective bit (a defective memory cell) is found in the memory cell array 1 of the semiconductor memory device 100, a bit line and a word line connected to the defective bit are specified. For example, when a memory cell MC34 illustrated in FIG. 6 is found as a defective bit, the bit line BL4 and the word line WL3 are specified as lines connected to the defective bit.

The semiconductor memory device 100 is set in a chamber of an FIB (Focused Ion Beam) device.

Then, as illustrated in FIGS. 6A and 6B, a processing portion corresponding to the plug V34 of the hook-up FA4 connected to the bit line BL4 is specified, the processing portion is irradiated with an FIB, and the passivation film PF is etched until the plug V34 is seen. As a result, a hole H1 that selectively exposes the plug V34 is formed. Next, a processing portion corresponding to the plug V35 of the hook-up FA5 connected to the word line WL3 is specified, the processing portion is irradiated with an FIB, and the passivation film PF is etched until the plug V35 is seen. As a result, a hole H2 that selectively exposes the plug V35 is formed.

Further, as illustrated in FIGS. 7A and 7B, the hole H1 is filled with a conductive material by an FIB, and so a probe electrode EL1 is formed on the plug V34. Similarly, the hole H2 is filled with a conductive material by an FIB, and so a probe electrode EL2 is formed on the plug V35. For example, the conductive materials are made of metal having molybdenum as a main component.

Then, the probe electrodes EL1 and EL2 are brought into contact with a needle of a pico-probe, and waveforms of the bit line BL4 and the word line WL3 are observed. For example, a forming bias is applied to the memory cell MC34, and then an inspection is performed on a failure cause or the like by reading an electric current in a state in which the memory cell MC34 is set or reset.

Figure 7:
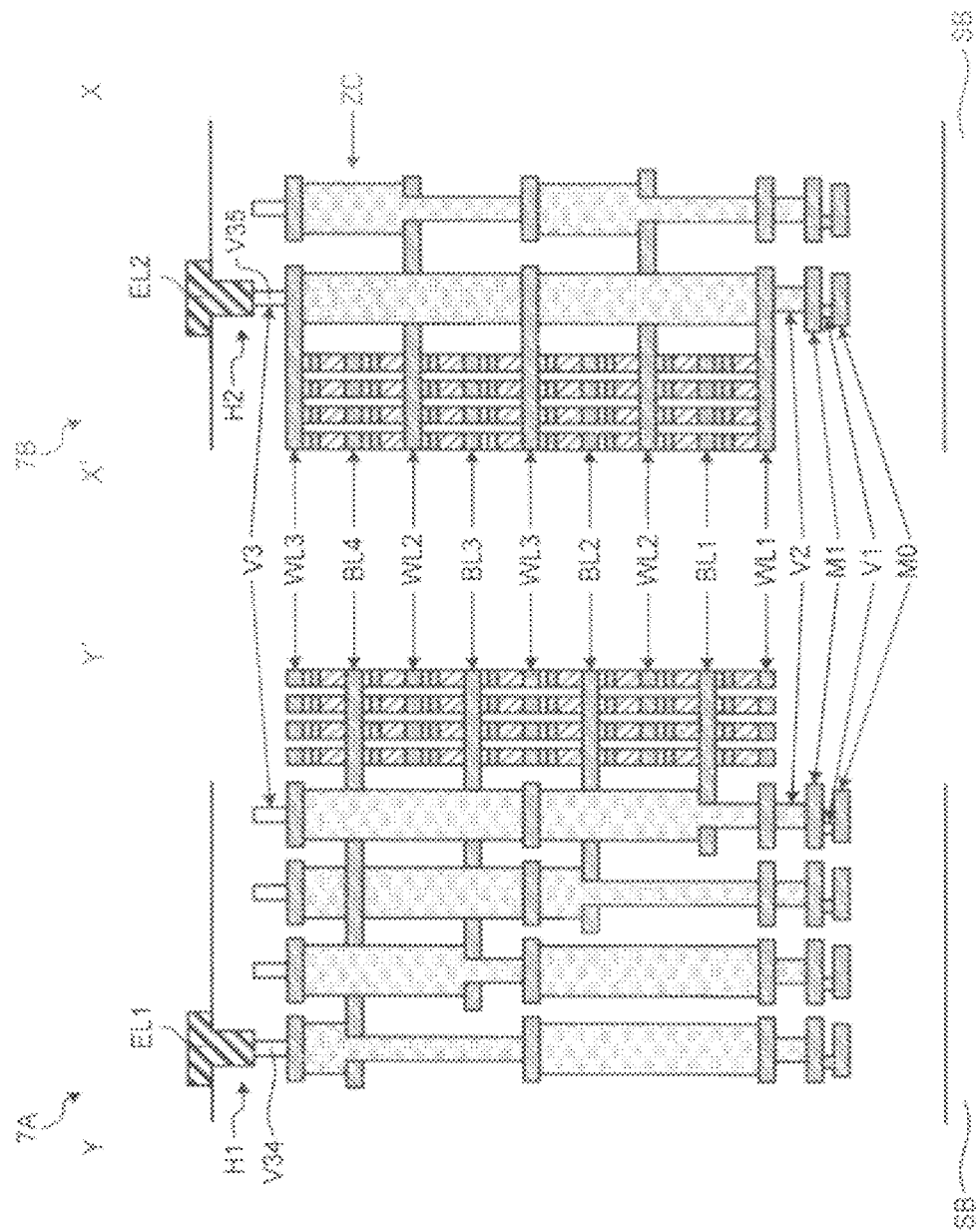
FIG. 7 is a diagram illustrating an effect according to the first embodiment.

FIGS. 6A and 6B and FIG. 7 exemplarily illustrate the example in which waveforms of the bit line and the word line are observed. However, an inspection may be performed such that a bias, a test pattern, or the like is applied from a pad of a chip, and a waveform of either of a bit line and a word line at that time is observed.

Figure 10:
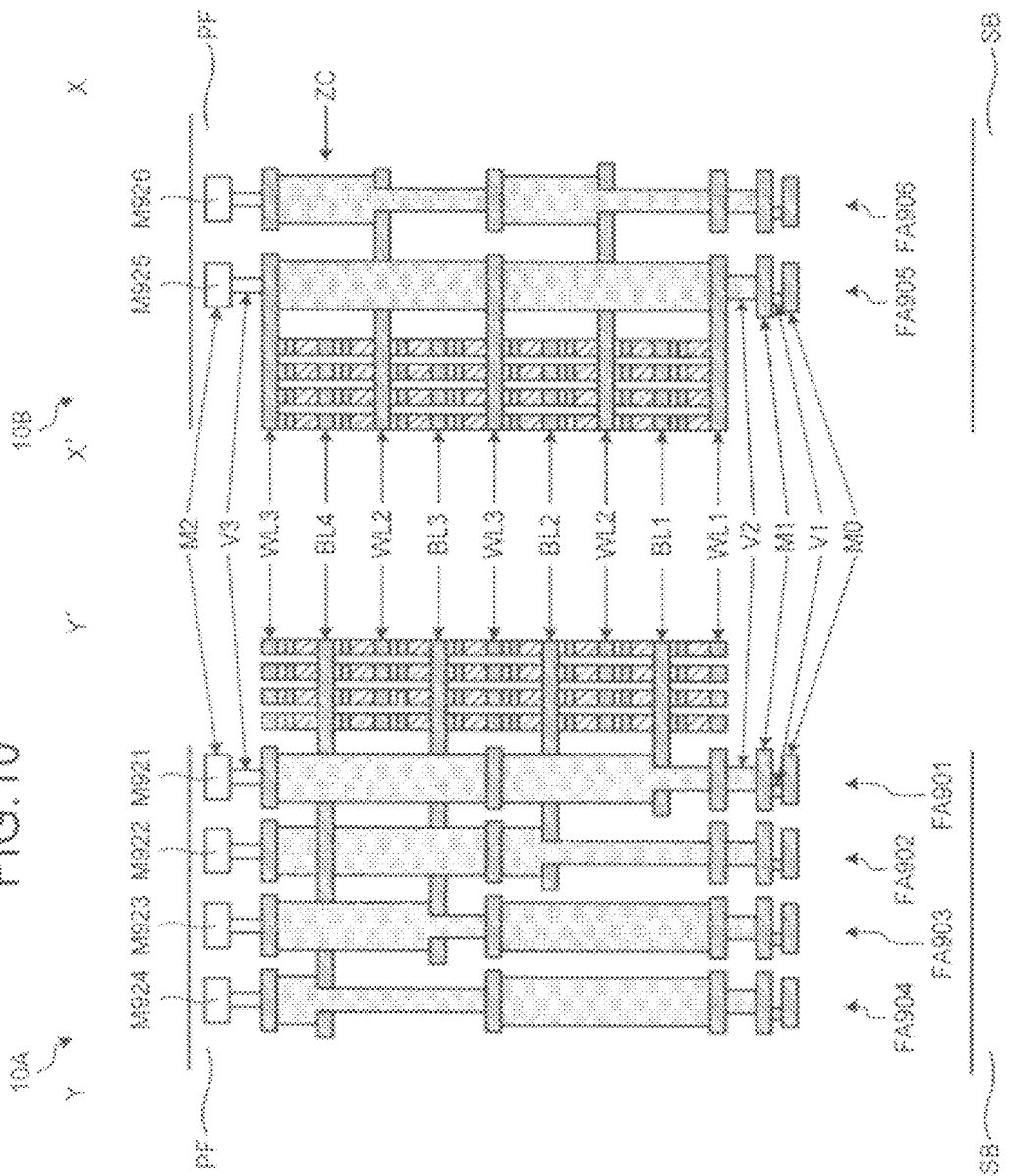
FIG. 10 is a diagram illustrating a cross-sectional structure of a signal-line-lead-out area according to a comparative example.
Figure 11:
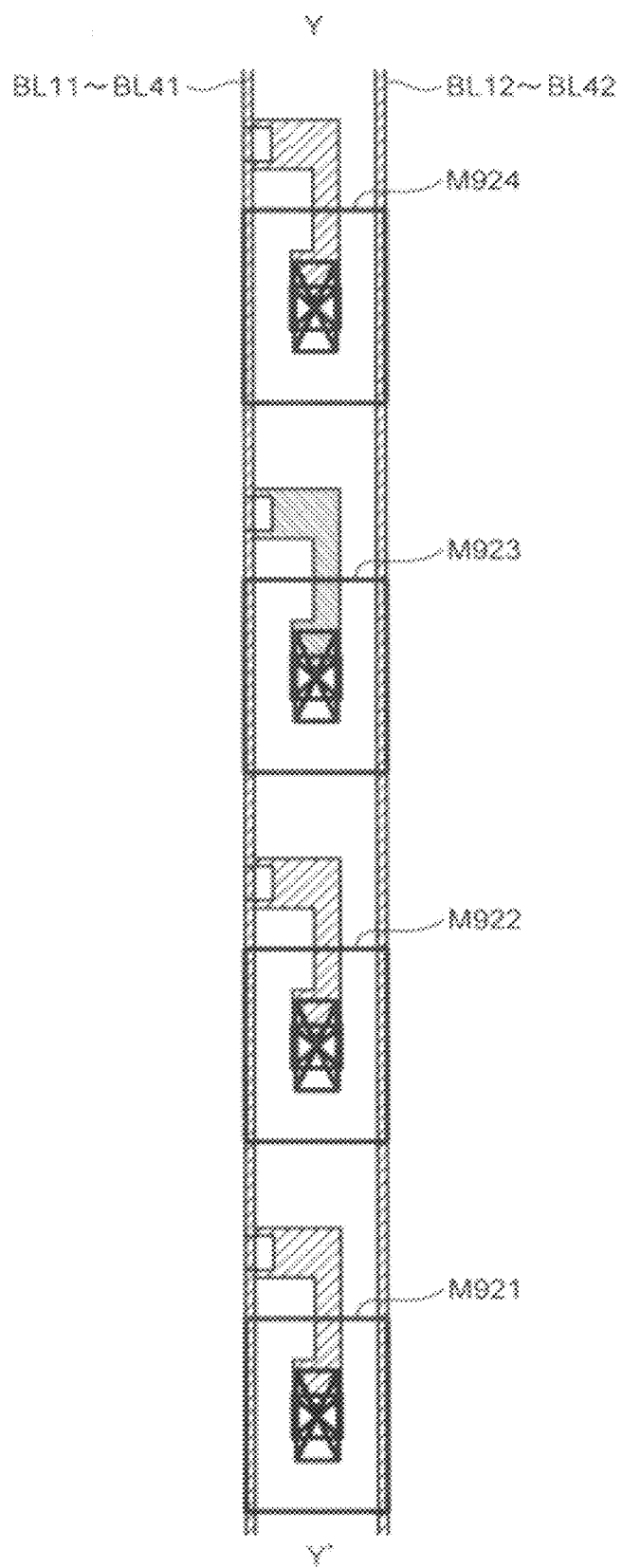
FIG. 11 is a diagram illustrating a layout configuration of a signal-line-lead-out area according to a comparative example.

Here, let us assume that hook-ups FA901 to FA906 include conductive patterns M921 to M926 in a wiring layer M2 of the top layer as inspection electrodes, respectively, as illustrated in FIGS. 10A and 10B. In this case, when a space of a bit line or a word line is reduced with the miniaturization of a memory cells, in the bit-line-lead-out area, the conductive patterns M921 to M924 functioning as inspection electrodes are arranged at positions interfering with bit lines BL11 to BL41 and BL12 to BL42 of both sides at a planar view as illustrated in FIG. 11. Thus, a design rule is unlikely to be satisfied. Further, with the miniaturization, it becomes difficult to arrange the conductive patterns M921 to M924 in a longitudinal direction. At this time, when processing of forcibly arranging the conductive patterns M921 to M924 functioning as inspection electrodes is performed in a state in which a design rule is not satisfied, a processing error, which causes the bit lines BL11 to BL41 and BL12 to BL42 of both sides to be erroneously short-circuited to each other, may occur. That is, since spaces of the bit lines BL11 to BL41 and BL12 to BL42 of both sides are reduced as the miniaturization of the memory cell progresses, it becomes difficult to arrange the conductive patterns M921 to M924 functioning as the inspection electrodes.

Figure 12:
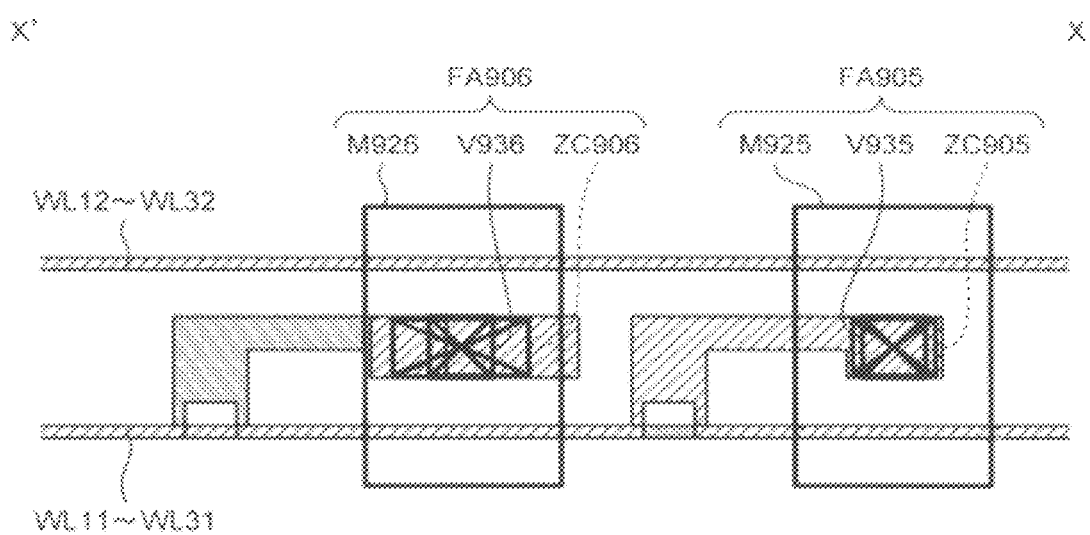
FIG. 12 is a diagram illustrating a layout configuration of a signal-line-lead-out area according to a comparative example.

Similarly, even in the word-line-lead-out area, conductive patterns M925 and M926 functioning as inspection electrodes are arranged at positions interfering with word lines WL11 to WL31 and WL12 to WL32 of both sides at a planar view as illustrated in FIG. 12. Thus, a design rule is unlikely to be satisfied. Further, with the miniaturization, it becomes difficult to arrange the conductive patterns M925 and M926 in a transverse direction. At this time, when processing of forcibly arranging the conductive patterns M925 and M926 functioning as inspection electrodes is performed in a state in which a design rule is not satisfied, a processing error, which causes the word lines WL11 to WL31 and WL12 to WL32 of both sides to be erroneously short-circuited to each other, may occur. That is, since spaces of the word lines WL11 to WL31 and WL12 to WL32 of both sides are reduced as the miniaturization of the memory cell progresses, it becomes difficult to arrange the conductive patterns M925 and M926 functioning as the inspection electrodes.

On the other hand, according to the first embodiment, the hook-ups FA1 to FA4 in the bit-line-lead-out area include the plugs V31 to V34 whose upper surface and side surface are covered with the passivation film PF as the inspection electrodes. Thus, as illustrated in FIG. 4, the plugs V31 to V34 functioning as the inspection electrodes are arranged at positions not interfering with the bit lines BL11 to BL41 and BL12 to BL42 of both sides at a planar view. Thus, a design rule can be easily satisfied. Further, the hook-ups FA5 and FA6 in the word-line-lead-out area include the plugs V35 and V36 whose top surface and side surface are covered with the passivation film PF as the inspection electrodes. Thus, as illustrated in FIG. 5, the plugs V35 and V36 functioning as the inspection electrodes are arranged at positions not interfering with the word lines WL11 to WL31 and WL12 to WL32 of both sides at a planar view. Thus, a design rule can be easily satisfied. As described above, according to the first embodiment, the inspection electrode for observing a waveform of a signal line such as a bit line or a word line can be easily provided.

Further, according to the first embodiment, a sufficient gap can be secured between the plugs V31 to V34 functioning as the inspection electrodes in the bit-line-lead-out area and adjacent inspection electrodes as illustrated in FIG. 4, compared to when the conductive patterns M921 to M924 in the wiring layer M2 of the top layer are used as the inspection electrode (FIG. 11). Thus, when an inspection is performed, a probe electrode formed on one plug can be easily prevented from coming into contact with an adjacent plug. Further, a sufficient gap can be secured between the plugs V35 and V36 functioning as the inspection electrodes in the word-line-lead-out area and adjacent inspection electrodes as illustrated in FIG. 4, compared to when the conductive patterns M925 and M926 in the wiring layer M2 of the top layer are used as the inspection electrode (FIG. 12). Thus, when an inspection is performed, a probe electrode formed on one plug can be easily prevented from coming into contact with an adjacent plug.

The first embodiment has been described in connection with the example in which the semiconductor memory device 100 is the ReRAM. However, the semiconductor memory device 100 may be a semiconductor memory device of any other type. For example, examples of the semiconductor memory device 100 include dynamic random access memory (DRAM), NAND flash memory, ferroelectric random access memory (FeRAM), magnetoresistive random access memory (MRAM), and phase change random access memory (PRAM).

Second Embodiment

Next, a semiconductor memory device 200 according to a second embodiment will be described. In the following, a description will be made in connection with points different from the first embodiment.

In the semiconductor memory device 200, each plug functioning as an inspection electrode in each hook-up has a planar shape in which the width in a direction parallel to a signal line connected to the hook-up is wider than the width in a direction intersecting the signal line.

Figure 8:
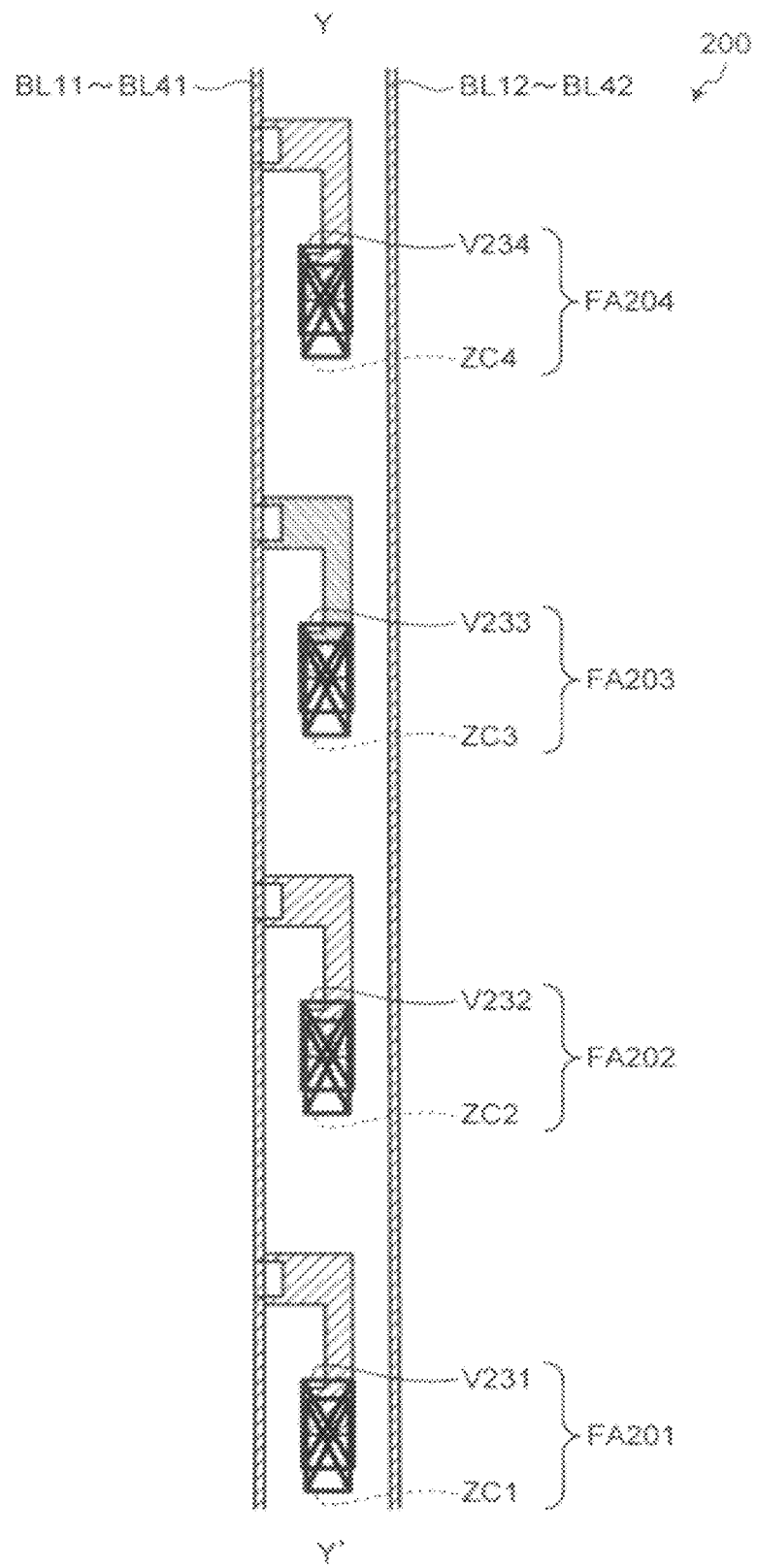
FIG. 8 is a diagram illustrating a layout configuration of a signal-line-lead-out area according to a second embodiment.

Specifically, as illustrated in FIG. 8, in the bit-line-lead-out area, hook-ups FA201 to FA204 include plugs V231 to V234 as inspection electrodes, respectively. In the plugs V231 to V234, the width in a direction parallel to bit lines BL11 to BL41 connected to the hook-ups FA201 to FA204 in a planar view is wider than the width in a direction intersecting the bit lines BL11 to BL41.

Figure 9:
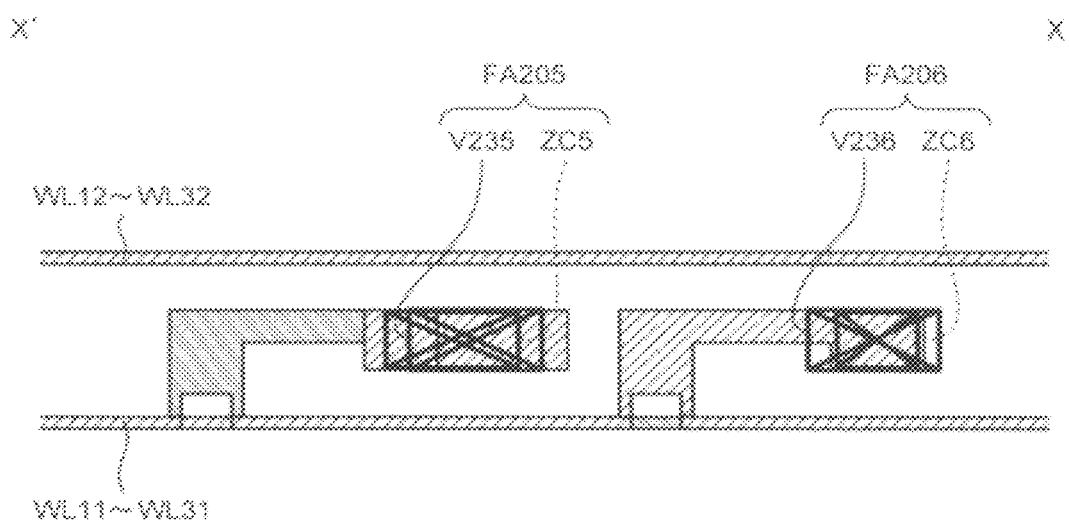
FIG. 9 is a diagram illustrating a layout configuration of a signal-line-lead-out area according to the second embodiment.

Similarly, as illustrated in FIG. 9, in the word-line-lead-out area, hook-ups FA205 and FA206 include plugs V235 and V236 as inspection electrodes, respectively. In the plugs V235 and V236, the width in a direction parallel to word lines WL11 to WL31 connected to the hook-ups FA205 and FA206 in a planar view is wider than the width in a direction intersecting the word lines WL11 to WL31.

As described above, according to the second embodiment, each plug functioning as an inspection electrode in each hook-up has a planar shape in which the width in a direction parallel to a signal line connected to the hook-up is wider than the width in a direction intersecting the signal line. Thus, the area of each plug in a planar view can be easily increased while securing the spaces of the inspection electrode and the bit lines or the word lines of both sides. Thus, when an inspection is performed, since a contact area between a plug and a probe electrode formed on the plug can be increased, the accuracy for observing a waveform of a signal line such as a bit line or a word line can be further improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array in which a plurality of memory cells are arranged;
a plurality of signal lines connected to the plurality of memory cells; and
a plurality of signal-line-lead-out portions arranged in a periphery of the memory cell array and connected to the plurality of signal lines,
wherein each of the plurality of signal-line-lead-out portions includes a plug as an electrode whose upper surface and side surface are covered with a passivation film.

2. The semiconductor memory device according to claim 1, wherein each of the plurality of signal-line-lead-out portions is configured such that a conductive pattern and a plug are alternately repeatedly stacked and includes a top plug as the plug whose upper surface and side surface are covered with the passivation film.

3. The semiconductor memory device according to claim 2, wherein the conductive pattern is formed of metal having aluminum as a main component, and
the plug is formed of metal having tungsten as a main component.

4. The semiconductor memory device according to claim 2, wherein each of the plurality of signal-line-lead-out portions transfers a signal of the signal line in a direction vertical to a principal surface of a semiconductor substrate and transfers the signal to the plug whose upper surface and side surface are covered with the passivation film.

5. The semiconductor memory device according to claim 1, wherein the plurality of signal lines include:
a plurality of bit lines; and
a plurality of word lines intersecting with the plurality of bit lines,
the plurality of signal-line-lead-out portions include:
a plurality of bit-line-lead-out portions that are arranged at a first side of the memory cell array and connected to the plurality of bit lines; and
a plurality of word-line-lead-out portions that are arranged at a second side of the memory cell array and connected to the plurality of word lines.

6. The semiconductor memory device according to claim 5, wherein the plurality of bit-line-lead-out portions are arranged in a bit line driver configured to drive the plurality of bit lines.

7. The semiconductor memory device according to claim 5, wherein each of the plurality of bit-line-lead-out portions is configured such that a conductive pattern and a plug are alternately repeatedly stacked and includes a top plug as the plug whose upper surface and side surface are covered with the passivation film.

8. The semiconductor memory device according to claim 7, wherein the conductive pattern is formed of metal having aluminum as a main component, and
the plug is formed of metal having tungsten as a main component.

9. The semiconductor memory device according to claim 5, wherein each of the plurality of bit-line-lead-out portions transfers a signal of the bit line in a direction vertical to a principal surface of a semiconductor substrate and transfers the signal to the plug whose upper surface and side surface are covered with the passivation film.

10. The semiconductor memory device according to claim 5, wherein each of the plurality of bit-line-lead-out portions is arranged along the bit line.

11. The semiconductor memory device according to claim 10, wherein the plug whose upper surface and side surface are covered with the passivation film in each of the plurality of bit-line-lead-out portions is arranged at a position not interfering with the bit line in a planar view.

12. The semiconductor memory device according to claim 5, wherein a plurality of memory cells are three-dimensionally arranged in the memory cell array, and
the plurality of bit-line-lead-out portions are connected to the plurality of bit lines that are different from each other in height.

13. The semiconductor memory device according to claim 5, wherein the plurality of word-line-lead-out portions are arranged in a word line driver for driving the plurality of word lines.

14. The semiconductor memory device according to claim 5, wherein each of the plurality of word-line-lead-out portions is configured such that a conductive pattern and a plug are alternately repeatedly stacked and includes a top plug as the plug whose upper surface and side surface are covered with a passivation film.

15. The semiconductor memory device according to claim 14, wherein the conductive pattern is formed of metal having aluminum as a main component, and
the plug is formed of metal having tungsten as a main component.

16. The semiconductor memory device according to claim 5, wherein each of the plurality of word-line-lead-out portions transfers a signal of the word line in a direction vertical to a principal surface of a semiconductor substrate and transfers the signal to the plug whose upper surface and side surface are covered with the passivation film.

17. The semiconductor memory device according to claim 5, wherein each of the plurality of word-line-lead-out portions is arranged along the word line.

18. The semiconductor memory device according to claim 17, wherein the plug whose upper surface and side surface are covered with the passivation film is arranged at a position not interfering the word line in a planar view.

19. The semiconductor memory device according to claim 1, wherein in the plug, a width in a direction parallel to a signal line connected to the signal-line-lead-out portion is wider than a width in a direction intersecting the signal line.

20. The semiconductor memory device according to claim 5, wherein in the plug in the bit-line-lead-out portion, a width in a direction parallel to the bit line connected to the bit-line-lead-out portion is wider than a width in a direction intersecting the bit line, and
in the plug in the word-line-lead-out portion, a width in a direction parallel to the word line connected to the word-line-lead-out portion is wider than a width in a direction intersecting the word line.

* * * * *